United States Patent
Kim et al.

(10) Patent No.: US 7,418,024 B2
(45) Date of Patent: Aug. 26, 2008

(54) HIGH POWER VERTICAL EXTERNAL CAVITY SURFACE EMITTING LASER

(75) Inventors: Ki-sung Kim, Hwaseong-si (KR); Taek Kim, Seongnam-si (KR); Heon-su Jeon, Gunpo-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 2 days.

(21) Appl. No.: 11/496,422

(22) Filed: Aug. 1, 2006

(65) Prior Publication Data

US 2007/0036187 A1  Feb. 15, 2007

(30) Foreign Application Priority Data

Aug. 9, 2005  (KR) ............... 10-2005-0072965

(51) Int. Cl.
*H01S 3/091* (2006.01)
(52) U.S. Cl. ........................... 372/75; 372/70
(58) Field of Classification Search ............... 372/75, 372/45.01, 72, 22, 21, 50.11
See application file for complete search history.

(56) References Cited

U.S. PATENT DOCUMENTS

| | | | | |
|---|---|---|---|---|
| 6,859,481 | B2 * | 2/2005 | Zheng | 372/70 |
| 2004/0013154 | A1 * | 1/2004 | Zheng | 372/96 |
| 2005/0281309 | A1 * | 12/2005 | Kim | 372/71 |

\* cited by examiner

*Primary Examiner*—Minsun Harvey
*Assistant Examiner*—Tuan N. Nguyen
(74) *Attorney, Agent, or Firm*—Buchanan Ingersoll & Rooney PC

(57) ABSTRACT

Provided is a vertical external cavity surface emitting laser (VECSEL) including: a bottom DBR mirror formed on a substrate; an RPG layer formed on the bottom DBR layer; a capping layer formed on the RPG mirror; an optical pump irradiating a pump beam onto a surface of the capping layer; and an external cavity mirror installed on an external surface of a stacked layer corresponding to the bottom DBR mirror. The RPG layer includes: a plurality of first barrier layers periodically formed on nodes of a standing wave and formed of a material having a larger energy band gap width than that of the pump beam; and a plurality of gain layers including a plurality of QW layers formed of InGaAs and disposed between the first barrier layers, and a plurality of second barrier layers disposed on upper and lower portions of the QW layers.

15 Claims, 4 Drawing Sheets

HIGH POWER VERTICAL EXTERNAL CAVITY SURFACE EMITTING LASER

CROSS-REFERENCE TO RELATED PATENT APPLICATIONS

Priority is claimed to Korean Patent Application No. 10-2005-0072965, filed on Aug. 9, 2005, in the Korean Intellectual Property Office, the disclosure of which is incorporated herein in its entirety by reference.

BACKGROUND OF THE DISCLOSURE

1. Field of the Disclosure

The present disclosure relates to a vertical external cavity surface emitting laser (VECSEL) device, and more particularly, to a VECSEL having an improved structure so that a gain efficiency can increase in quantum well layers and/or a lasing efficiency can be improved in various embodiments.

2. Description of the Related Art

A vertical cavity surface emitting laser (VCSEL) has a high coupling efficiency because it generates single longitudinal mode lasing in a narrow spectrum and also at a narrow projection angle. Furthermore, the VCSEL can be easily monolithic-integrated into other devices due to its structure, and thus, it is suitable for a pump laser diode (LD).

However, the area of a lasing region should be 10 μm or smaller for single lateral mode lasing, and even in this case, the single lateral mode may be changed into multi-mode due to a thermal lens effect according to an optical output increase. Therefore, the maximum output of single lateral mode lasing is generally 5 mK or less.

To retain the advantages of the VCSEL while increasing high emission power, a vertical external cavity surface emitting laser (VECSEL) has been developed. The VECSEL has a gain region that is increased by replacing an upper distributed Bragg reflector (DBR) with an external mirror so that the VECSEL can generate lasing at a high emission power of 100 mW or more. Because it is difficult to obtain sufficient gain in a surface emitting layer since the surface emitting laser has a smaller gain volume than that of an edge emitting laser, a VECSEL device of periodic gain structure, in which quantum wells are periodically disposed, has been developed. In addition, since there is a limitation to perform carrier injection evenly onto a larger area with an electric pumping operation, an optical pumping type VECSEL device has been developed for obtaining high output power.

FIG. 1 is a schematic cross-sectional view of a conventional 920 nm VECSEL device.

Referring to FIG. 1, the conventional VECSEL includes a substrate 10, and a DBR mirror 20, a multiple quantum well (MQW) active area 30, and a capping layer 52 that are sequentially formed on the substrate 10, an optical pump 60 supplying a pump beam and an external cavity mirror 70 formed corresponding to the DBR mirror 20 at an external portion. The DBR mirror 20 includes a plurality of low refractive layers 20a and a plurality of high refractive layers 20b that are repeatedly stacked, and the MQW active layer 30 includes a plurality of GaAs barrier layers 30a and a plurality of InGaAs quantum well (QW) layers 30b that are repeatedly stacked.

FIG. 2 is a schematic energy band diagram of the VECSEL device of FIG. 1, and FIG. 3 is a graph illustrating photoluminescence (PL) intensity according to an increase of pumping power in the VECSEL of FIG. 1.

Referring to FIGS. 2 and 3, when the pumping power increases, recombination of electrons and holes is generated more at the barrier area than in the InGaAs QW layers. Therefore, a noise beam is generated with a laser beam of 920 nm wavelength that is meant to be obtained from the VCESEL device, and thus, lasing efficiency of the 920 nm VECSEL device may be degraded. Therefore, a VECSEL device having a structure capable of improving the lasing efficiency is required.

SUMMARY OF THE DISCLOSURE

The present disclosure provides a VECSEL that can improve a lasing efficiency by increasing a gain efficiency in a quantum well layer.

According to an aspect of the present disclosure, there is provided a vertical external cavity surface emitting laser (VECSEL) device including: a bottom distributed Bragg reflector (DBR) mirror formed on a substrate; a resonant periodic gain (RPG) layer formed on the bottom DBR mirror; a capping layer formed on the RPG layer; an optical pump irradiating a pump beam onto a surface of the capping layer; and an external cavity mirror installed above an external surface of a stacked layer corresponding to the bottom DBR mirror, wherein the RPG layer includes: a plurality of first barrier layers periodically formed on nodes of a standing wave and formed of a material having a larger energy band gap width than the energy of the pump beam; and a plurality of gain layers comprising a plurality of quantum well (QW) layers formed of InGaAs material and disposed between the first barrier layers, and a plurality of second barrier layers disposed on upper and lower portions of the QW layers.

The first barrier layers may be formed of a material having a larger energy band gap width than that of InGaAs. The first barrier layers may include at least one of an $Al_xGa_{(1-x)}As$ (0.08≦x≦1) layer and a $GaAs_{(1-y)}P_y$ (0.1<y<1) layer. The first barrier layers may be multi-layers having composition gradients, and may be formed to thicknesses of 2 nm through 40 nm.

The gain layers may be disposed on antinodes of the standing wave. The gain layers may include two through seven QW layers.

The second barrier layers may include at least one of an $Al_xGa_{(1-x)}As$ (0≦x≦0.08) layer and a $GaAs_{(1-y)}P_y$ (0≦y≦1) layer. The second barrier layers may be strain compensation layers for relieving strain of the QW layers.

The bottom DBR mirror may be formed by alternately stacking an AlAs layer and an $Al_xGa_{(1-x)}As$ (0≦x<1). The capping layer may be formed of $Al_xGa_{(1-x)}As$ (0≦x<1).

The VECSEL device may emit a laser beam having a wavelength of between 870 nm and 950 nm.

BRIEF DESCRIPTION OF THE DRAWINGS

The above and other features and advantages of various embodiments of the present invention will become more apparent by describing in detail exemplary embodiments thereof with reference to the attached drawings in which.

DETAILED DESCRIPTION OF THE EXEMPLARY EMBODIMENTS

Figure 1:
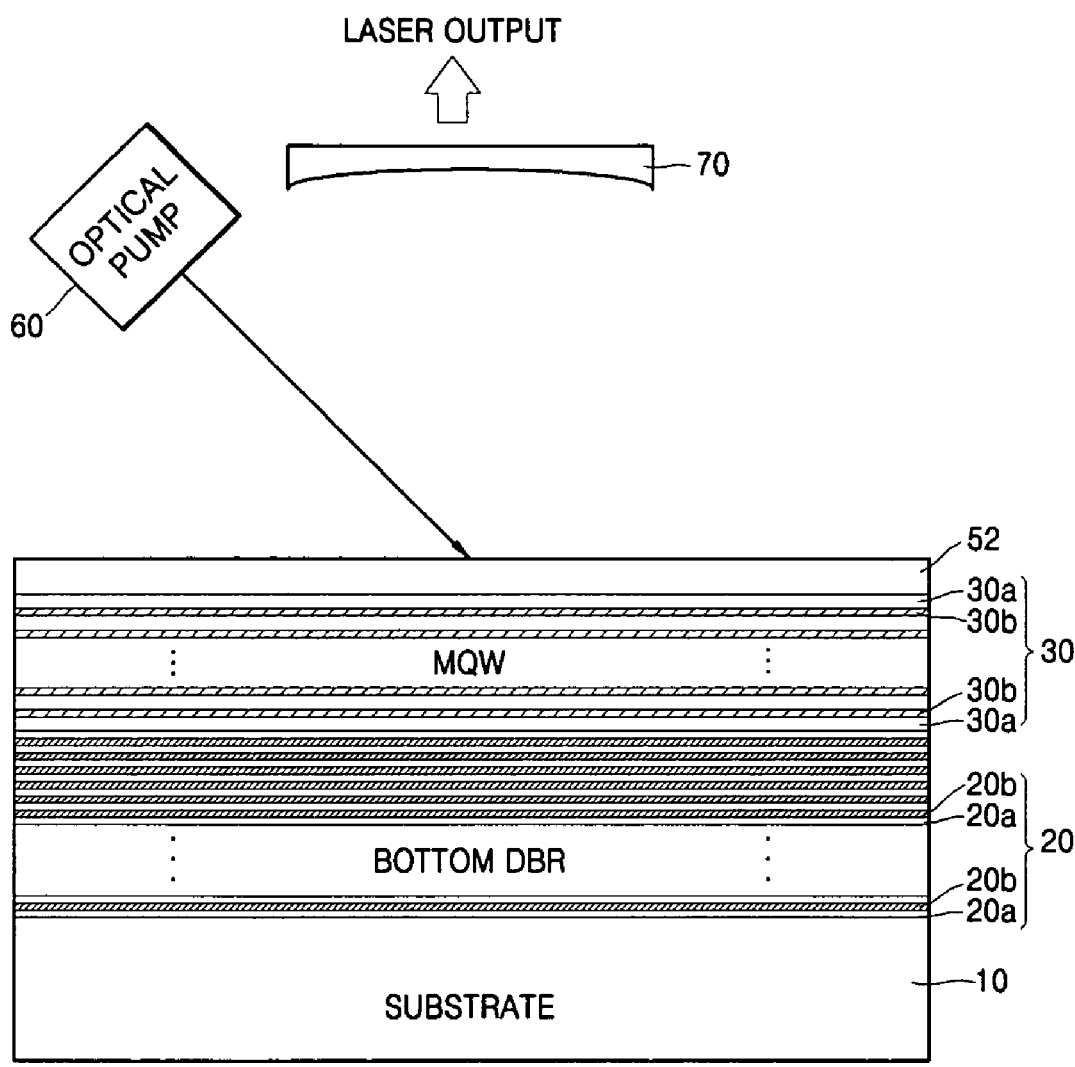
FIG. 1 is a schematic cross-sectional view of a conventional 920 nm VECSEL device.
Figure 2:
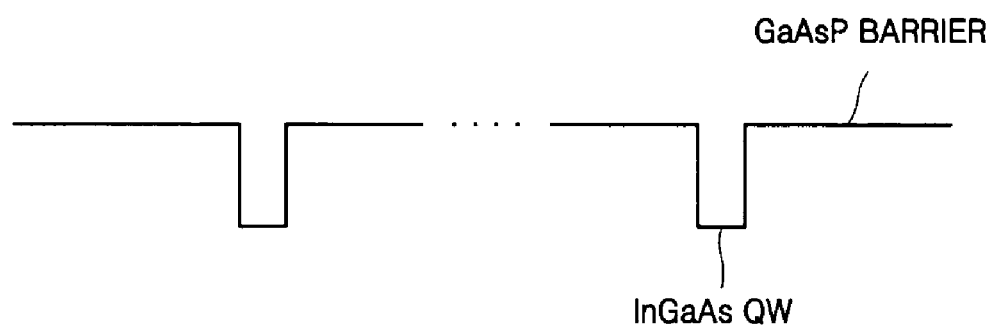
FIG. 2 is a schematic energy band diagram of the VECSEL device of FIG. 1.
Figure 3:
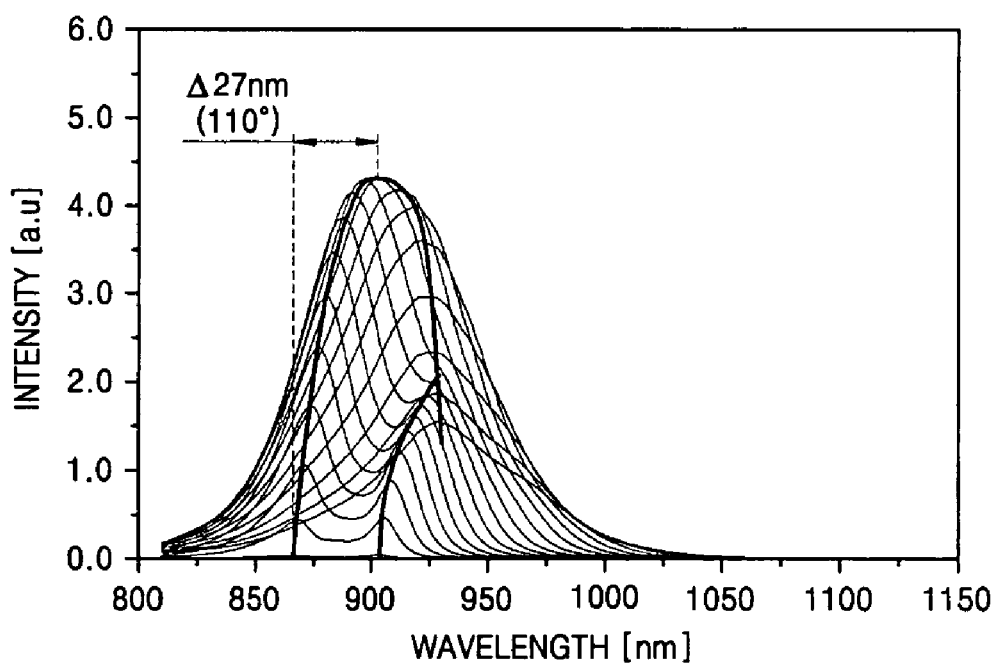
FIG. 3 is a graph of photoluminescence (PL) intensity according to an increase of pumping power in the VECSEL device of FIG. 1.

The present invention will now be described more fully with reference to the accompanying drawings, in which certain exemplary embodiments of the invention are shown. In the drawings, the thicknesses of layers and regions are exaggerated for clarity.

Figure 4:
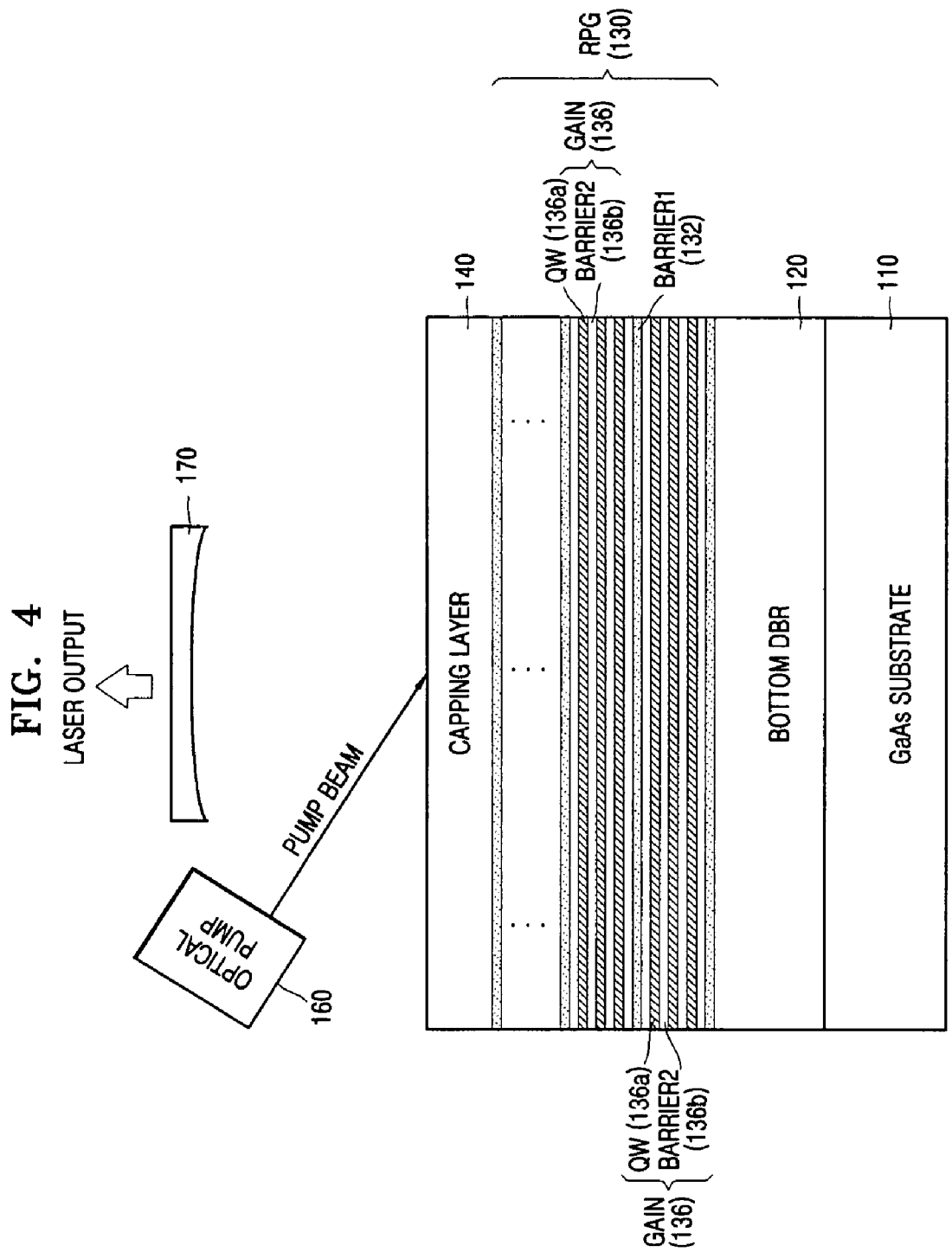
FIG. 4 is a schematic cross-sectional view of a VECSEL device according to an embodiment of the present disclosure.

FIG. 4 is a schematic cross-sectional view of a vertical external cavity surface emitting laser (VECSEL) device according to an embodiment of the present disclosure.

Referring to FIG. 4, the VECSEL device according to the present disclosure includes a bottom distributed Bragg reflector (DBR) mirror 120, a resonant periodic gain (RPG) layer 130, and a capping layer 140 that are sequentially stacked on a GaAs substrate 110, and an optical pump 160 irradiating a pump beam onto a surface of the capping layer 140 and an external cavity mirror 170 installed above an external portion to correspond to the bottom DBR mirror 120. In the current embodiment, the RPG layer 130 includes a plurality of first barrier layers 132 periodically disposed on nodes of a standing wave of the laser cavity, and a plurality of gain layers 136 disposed between the first barrier layers 132. In particular, the first barrier layers 132 are formed of a material having a larger band gap width than the energy of the pump beam. Moreover, the first barrier layers 132 can be formed of a material having a larger band gap width than that of InGaAs material. For example, the first barrier layers 132 can include an $Al_xGa_{(1-x)}As$ ($0.08 \leq x \leq 1$) material layer or a $GaAs_{(1-y)}P_y$ ($0.1 < y < 1$) material layer, or can include both of them. Preferably, the first barrier layers 132 may be multi-layers having composition gradients, and can be formed to thickness of 2 nm through 40 nm.

The gain layers 136 include a plurality of quantum well (QW) layers 136a formed of the InGaAs material, and a plurality of second barrier layers 136b formed on upper and lower portions of the QW layers 136a and disposed at antinodes of the standing wave. The gain layers 136 can be formed as multi-QW layers including two~seven QW layers 136a, and the multi-QW layer structure can improve an extraction efficiency of the VECSEL device.

The second barrier layers 136b can include at least one of the $Al_xGa_{(1-x)}As$ ($0 \leq x \leq 0.08$) material layer and the $GaAs_{(1-y)}P_y$ ($0 \leq y \leq 1$) material layer, and thicknesses of the second barrier layers 136b can be controlled so as to perform as strain compensation layers for relieving strain of the QW layers 136a.

The bottom DBR mirror 120 can be formed by alternately stacking AlAs material layers and $Al_xGa_{(1-x)}As$ ($0 \leq x < 1$) material layers, and the capping layer 140 can be formed of the $Al_xGa_{(1-x)}As$ ($0 \leq x < 1$) material.

In the VECSEL device having the above structure, a quantum confinement effect of the QW layer 136a can be improved by the first barrier layers 132, and thus, the extraction efficiency of the QW layers 136a can be improved. In particular, since the first barrier layers 132 are formed of a material having a large energy band gap, it is difficult to recombine the electrons and the holes in the first barrier layers 132. In a conventional VECSEL device, a noise beam having a wavelength of 870 nm or less is generated due to recombination of electrons and holes in a barrier layer. However, according to the present disclosure, when the first barrier layers 132 are disposed in the RPG layer 130, recombination of electrons and holes can be restrained. Therefore, generation of a noise beam having a wavelength of 870 nm or less from the VECSEL device can be prevented. Therefore, the VECSEL device having the above structure can emit a high quality laser beam having a wavelength of between 870 nm and 950 nm. In addition, according to the VECSEL device of the current embodiment, each of the gain layers 136 is formed to have the multi-QW layer structure, and thus, the extraction efficiency of the VECSEL device can increase.

Figure 5:
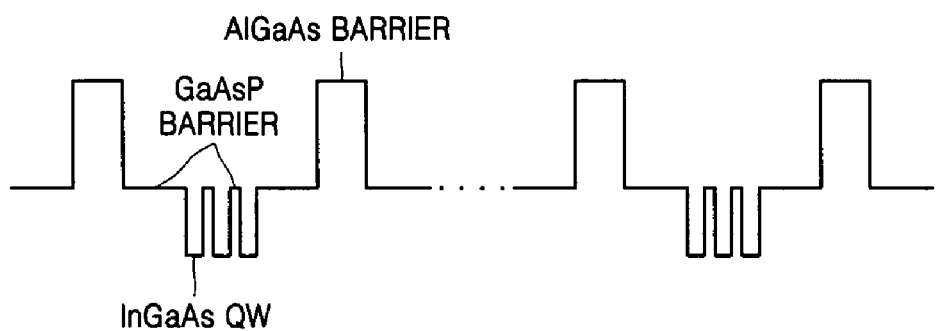
FIG. 5 is a schematic energy band diagram of the VECSEL device of FIG. 4.
Figure 6:
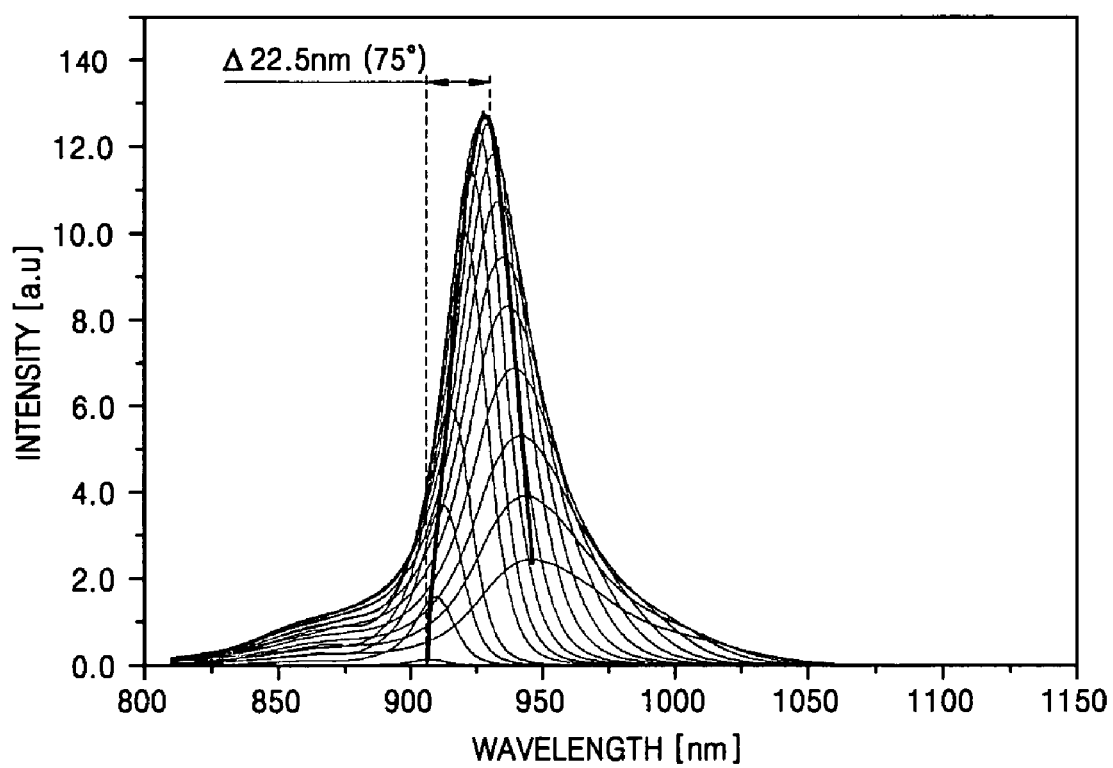
FIG. 6 is a graph of PL intensity according to an increase of pumping power in the VECSEL device of FIG. 4.

FIG. 5 is a schematic energy band diagram of the VECSEL device of FIG. 4, and FIG. 6 is a graph of a photoluminescence (PL) intensity according to an increase of pumping power in the VECSEL device of FIG. 4. Referring to FIGS. 5 and 6, when the pumping power increases, the amount of beam generated by the InGaAs QW layers is greatly increased.

Table 1 illustrates layer names, compositions, and thicknesses of the stacked layers in the VECSEL device according to an exemplary embodiment of the present disclosure.

TABLE 1

| STRUCTURE (LAYER NAME) | | | COMPOSITION | THICKNESS (nm) | PERIODICITY |
|---|---|---|---|---|---|
| CAPPING | | | GaAs | 10 | 1 |
| | | | $Al_{0.3}GaAs$ | 259.8 | 1 |
| RPG | BARRIER 1 | | $Al_{0.3}GaAs$ | 86.1 | 1 |
| | | | $Al_{0.08}GaAs$ | 20 | 1 |
| | GAIN | BARRIER 2 | $GaAsP_{0.1}$ | 10 | 1 |
| | | QW | $In_{0.09}GaAs$ | 7.05 | 1 |
| | | BARRIER 2 | $GaAsP_{0.1}$ | 5 | 1 |
| | | QW | $In_{0.09}GaAs$ | 7.05 | 1 |
| | | BARRIER 2 | $GaAsP_{0.1}$ | 5 | 10 |
| | | QW | $In_{0.09}GaAs$ | 7.05 | |
| | | BARRIER 2 | $GaAsP_{0.1}$ | 10 | |
| | BARRIER 1 | | $Al_{0.08}GaAs$ | 20 | |
| | | | $Al_{0.3}GaAs$ | 37 | |
| | | | $Al_{0.08}GaAs$ | 20 | |
| | GAIN | BARRIER 2 | $GaAsP_{0.1}$ | 10 | |
| | | QW | $In_{0.09}GaAs$ | 7.05 | |
| | | BARRIER 2 | $GaAsP_{0.1}$ | 5 | |
| | | QW | $In_{0.09}GaAs$ | 7.05 | |
| | | BARRIER 2 | $GaAsP_{0.1}$ | 5 | 1 |
| | | QW | $In_{0.09}GaAs$ | 7.05 | |
| | | BARRIER 2 | $GaAsP_{0.1}$ | 10 | 1 |

TABLE 1-continued

| STRUCTURE (LAYER NAME) | COMPOSITION | THICKNESS (nm) | PERIODICITY |
|---|---|---|---|
| BARRIER 1 | $Al_{0.08}GaAs$ | 20 | 1 |
| | $Al_{0.3}GaAs$ | 86.1 | 1 |
| DBR | AlAs | 72.5 | 1 |
| | $Al_{0.2}GaAs$ | 63.2 | 30 |
| | AlAs | 72.5 | |

According to the present disclosure, the quantum confinement effect can be improved in the QW layers, and the gain efficiency and the lasing efficiency of the VCESEL can be improved. In addition, a laser beam having a wavelength between, for example, of 870 nm through 950 nm, can be obtained easily from the VECSEL device, and a noise beam having a wavelength of 870 nm or less can be reduced greatly.

Therefore, in the VECSEL device according to the present disclosure, the extraction efficiency of the QW layers can be improved greatly, and the laser output of the VECSEL device can increase.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A vertical external cavity surface emitting laser (VECSEL) device comprising:
a bottom distributed Bragg reflector (DBR) mirror formed on a substrate;
a resonant periodic gain (RPG) layer formed on the bottom DBR mirror;
a capping layer formed on the RPG layer;
an optical pump irradiating a pump beam onto a surface of the capping layer; and
an external cavity mirror installed above an external surface of a stacked layer corresponding to the bottom DBR mirror,
wherein the RPG layer comprises:
a plurality of first barrier layers periodically formed on nodes of a standing wave and formed of a material having a larger energy band gap width than an energy of the pump beam; and
a plurality of gain layers comprising a plurality of quantum well (QW) layers formed of InGaAs material and disposed between the first barrier layers, and a plurality of second barrier layers disposed on upper and lower portions of the QW layers, wherein the first barrier layers comprise at least one of an $Al_xGa_{(1-x)}As$ ($0.08 \leq x \leq 1$) layer and a $GaAs_{(1-y)}P_y$ ($0.1 < y < 1$) layer.

2. The VECSEL device of claim 1, wherein the gain layers are disposed on antinodes of the standing wave.

3. The VECSEL device of claim 1, wherein the first barrier layers are formed of a material having a larger energy band gap width than that of InGaAs.

4. The VECSEL device of claim 1, wherein the first barrier layers are multi-layers having composition gradients.

5. The VECSEL device of claim 1, wherein the first barrier layers are formed to thicknesses of 2 nm through 40 nm.

6. The VECSEL device of claim 1, wherein the gain layers include two through seven QW layers.

7. A vertical external cavity surface emitting laser (VECSEL) device comprising:
a bottom distributed Bragg reflector (DBR) mirror formed on a substrate;
a resonant periodic gain (RPG) layer formed on the bottom DBR mirror;
a capping layer formed on the RPG layer;
an optical pump irradiating a pump beam onto a surface of the capping layer; and
an external cavity mirror installed above an external surface of a stacked layer corresponding to the bottom DBR mirror,
wherein the RPG layer comprises:
a plurality of first barrier layers periodically formed on nodes of a standing wave and formed of a material having a larger energy band gap width than an energy of the pump beam; and
a plurality of gain layers comprising a plurality of quantum well (QW) layers formed of InGaAs material and disposed between the first barrier layers, and a plurality of second barrier layers disposed on upper and lower portions of the QW layers, wherein the second barrier layers include at least one of an $Al_xGa_{(1-x)}As$ ($0 \leq x \leq 0.08$) layer and a $GaAs_{(1-y)}P_y$ ($0 \leq y \leq 1$) layer.

8. The VECSEL device of claim 7, wherein the second barrier layers are strain compensation layers for compensating strain of the QW layers.

9. The VECSEL device of claim 1, emitting a laser beam having a wavelength of between 870 nm and 950 nm.

10. The VECSEL device of claim 1, wherein the bottom DBR mirror is formed by alternately stacking an AlAs layer and an $Al_xGa_{(1-x)}As$ ($0 \leq x < 1$).

11. The VECSEL device of claim 1, wherein the capping layer is formed of $Al_xGa_{(1-x)}As$ ($0 \leq x < 1$).

12. The VECSEL device of claim 1, wherein the first barrier layers are formed of a material having a larger energy band gap width than a material of the second barrier layers.

13. A vertical external cavity surface emitting laser (VECSEL) device comprising:
a bottom distributed Bragg reflector (DBR) mirror formed on a substrate;
a resonant periodic gain (RPG) layer formed on the bottom DBR mirror;
a capping layer formed on the RPG layer;
an optical pump irradiating a pump beam onto a surface of the capping layer; and
an external cavity mirror installed above an external surface of a stacked layer corresponding to the bottom DBR mirror,
wherein the RPG layer comprises:
a plurality of first barrier layers periodically formed on nodes of a standing wave and formed of a material having a larger energy band gap width than an energy of the pump beam; and
a plurality of gain layers comprising a plurality of quantum well (QW) layers formed of InGaAs material and disposed between the first barrier layers, and a plurality of second barrier layers disposed on upper and lower portions of the QW layers wherein the first barrier layers comprise AlGaAs layers, the second barrier layers comprise GaAsP layers and the quantum layers comprise InGaAs layers.

14. A vertical external cavity surface emitting laser (VECSEL) device comprising:

a bottom distributed Bragg reflector (DBR) mirror formed on a substrate;

a resonant periodic gain (RPG) layer formed on the bottom DBR mirror;

a capping layer formed on the RPG layer;

an optical pump irradiating a pump beam onto a surface of the capping layer; and an external cavity mirror installed above an external surface of a stacked layer corresponding to the bottom DBR mirror, wherein the RPG layer comprises:

a plurality of first barrier layers periodically formed on nodes of a standing wave and formed of a material having a larger energy band gap width than an energy of the pump beam; and a plurality of gain layers comprising a plurality of quantum well (QW) layers formed of InGaAs material and disposed between the first barrier layers, and a plurality of second barrier layers disposed on upper and lower portions of the QW layers, wherein the first barrier layers have a larger energy band gap than the second barrier layers, and wherein the second barrier layers have a larger energy band gap than the quantum wells.

15. A vertical external cavity surface emitting laser (VECSEL) device comprising:

a bottom distributed Bragg reflector (DBR) mirror formed on a substrate;

a resonant periodic gain (RPG) layer formed on the bottom DBR mirror;

a capping layer formed on the RPG layer;

an optical pump irradiating a pump beam onto a surface of the capping layer; and an external cavity mirror installed above an external surface of a stacked layer corresponding to the bottom DBR mirror, wherein the RPG layer comprises:

a plurality of first barrier layers periodically formed on nodes of a standing wave and formed of a material having a larger energy band gap width than an energy of the pump beam; and a plurality of gain layers comprising a plurality of quantum well (QW) layers formed of InGaAs material and disposed between the first barrier layers, and a plurality of second barrier layers disposed on upper and lower portions of the QW layers, wherein the first barrier layers comprise AlGaAs, wherein the second barrier layers comprise GaAsP and the quantum wells comprising InGaAs.

* * * * *